United States Patent [19]

Perrotti

[11] 4,132,992
[45] Jan. 2, 1979

[54] RADIATOR/CIRCUIT INCORPORATING A CROSS SLOT WAVEGUIDE ANTENNA ARRAY WHICH WILL INSTANTANEOUSLY MEASURE THE RADIATION AXIAL RATIO OR DEGREE OF LINEAR POLARIZATION OF ANY ANTENNA

[75] Inventor: Emmanuel J. Perrotti, Ramsey, N.J.

[73] Assignee: International Telephone and Telegraph Corporation, Nutley, N.J.

[21] Appl. No.: 834,093

[22] Filed: Sep. 19, 1977

[51] Int. Cl.² ............................................. C01R 29/08
[52] U.S. Cl. ................................. 343/100 PE; 324/95; 343/703
[58] Field of Search ................. 343/100 PE, 703, 756, 343/768, 771; 324/95

[56] References Cited

U.S. PATENT DOCUMENTS

| 2,982,960 | 5/1961 | Shanks | 343/771 |
|---|---|---|---|
| 3,890,571 | 6/1975 | Beyer | 343/703 |

Primary Examiner—Eli Lieberman
Attorney, Agent, or Firm—John T. O'Halloran; Alfred C. Hill

[57] ABSTRACT

The circuit includes a receiving circularly polarized crossed slot waveguide antenna having a longitudinal axis and spaced crossed slots disposed on a selected side of said axis spaced therefrom; and a broadband matched magic "TEE" hybrid having an output difference port, an output sum port, a first input port coupled to the receiving antenna to receive therefrom left-hand circularly polarized waves and a second input port coupled to the receiving antenna to receive therefrom right-hand circularly polarized waves. A microwave meter is coupled to the difference port to detect the value of the difference ($\Delta$) of the waves coupled to the first and second input ports and another microwave meter coupled to the sum port to detect the value of the sum ($\Sigma$) of the waves coupled to the first and second input ports to enable solving the equation $R = 20 \log \Sigma/\Delta$ to obtain the value R of the radiation axial ratio.

11 Claims, 3 Drawing Figures

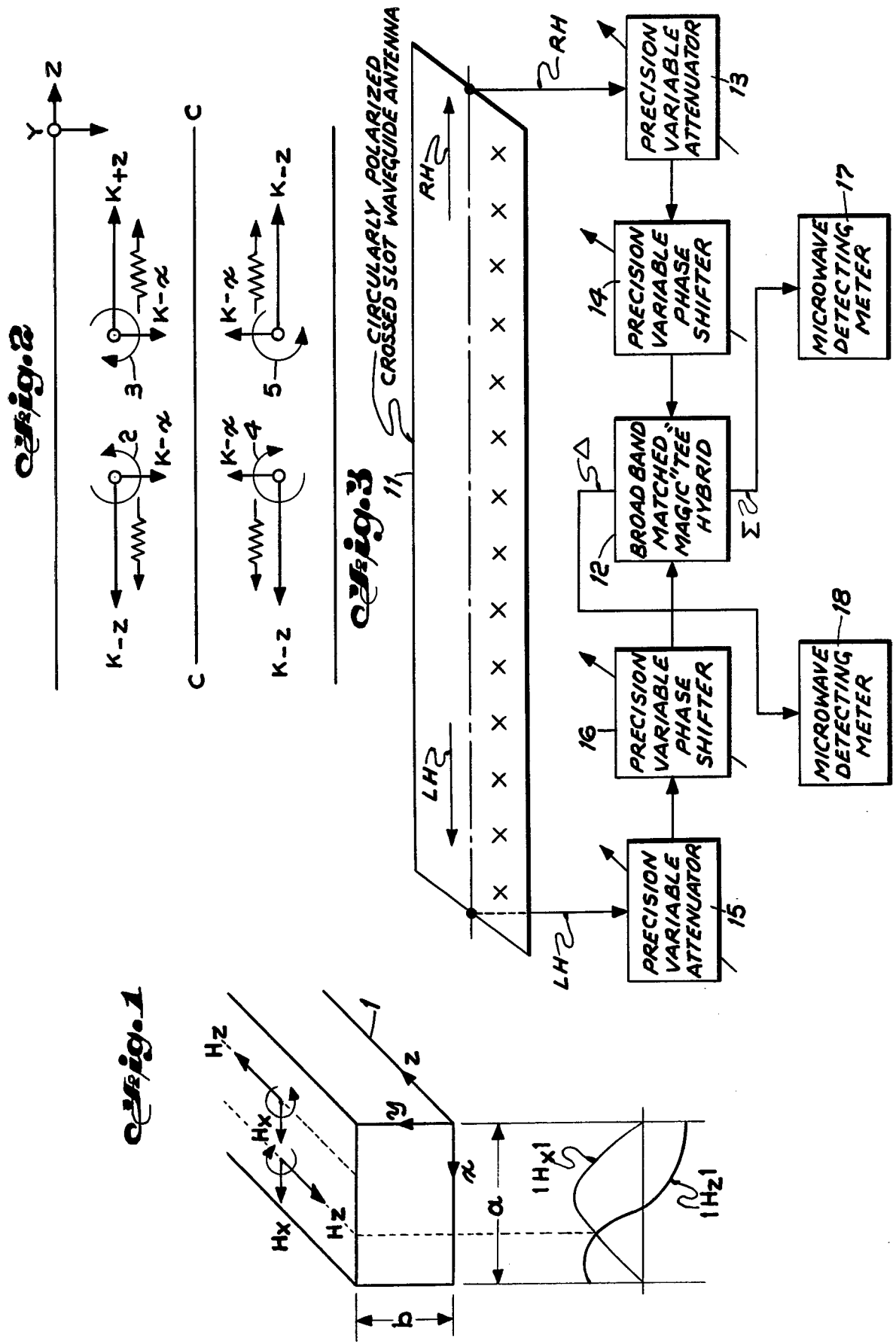

RADIATOR/CIRCUIT INCORPORATING A CROSS SLOT WAVEGUIDE ANTENNA ARRAY WHICH WILL INSTANTANEOUSLY MEASURE THE RADIATION AXIAL RATIO OR DEGREE OF LINEAR POLARIZATION OF ANY ANTENNA

BACKGROUND OF THE INVENTION

This invention relates to measuring the radiation axial ratio of any antenna instantaneously without the use of a revolving linearly polarized sampling antenna.

At present, the usual methods employed in measuring the radiation axial ratio of antennas is to employ a linearly polarized antenna which can rotate about its propagation axis. Although this method is extensively employed, difficulties are often encountered because of the variation of reflected energy with rotation, particularly on outdoor ranges, which results in unreliable measurements. Further inaccuracies also come about in the narrow beam rotating sampling antennas, which are employed on long ranges where high grain is required, due to the lobing effects which come about from misaligned antenna beams or from angular offsets of a rotating feed in a dish.

SUMMARY OF THE INVENTION

An object of the present invention is to provide a radiator/circuit for measuring the radiation axial ratio of any antenna with any polarization.

Another object of the present invention is to provide a non-rotating (fixed beam antenna) circuit for measuring the radiation axial ratio of any antenna with any polarization which can instantaneously provide the radiation axial ratio without having to read maximum and minimum signals through a full revolution of the sampling antenna.

A feature of the present invention is the provision of a radiator/circuit for measuring the radiation axial ratio (R) of any antenna with any polarization. The radiator/circuit is comprised of: of receiving circularly polarized crossed slot waveguide antenna having a longitudinal axis and spaced crossed slots disposed on a selected side of said axis spaced therefrom; first means having an output difference port, an output sum port, a first input port coupled to the receiving antenna to receive therefrom left-hand circularly polarized waves and a second input port coupled to the receiving antenna to receive therefrom right-hand circularly polarized waves; and second means coupled to the difference port to detect the value of the difference ($\Delta$) of the waves coupled to the first and second input ports and to the sum port to detect the value of the sum ($\Sigma$) of the waves coupled to the first and second input ports to enable solving the equation $R = 20 \log \Sigma/\Delta$ to obtain the value of the radiation axial ratio.

Another feature of the present invention is the provision of in addition to the above elements third means coupled between the first input port and the receiving antenna; and fourth means coupled between the first input port and the receiving antenna where the third and fourth means cooperate to eliminate residual signals to provide a condition for pure circular polarization.

BRIEF DESCRIPTION OF THE DRAWING

Above-mentioned and other features and objects of this invention will become more apparent by reference to the following description taken in conjunction with the accompanying drawing, in which:

FIG. 1 is a schematic diagram illustrating the waveguide field configuration for a $TE_{10}$ mode waveguide;

FIG. 2 is a schematic illustration of the currents in a $TE_{10}$ waveguide mode for opposite directions of propagation; and FIG. 3 is a block diagram of the radiator/circuit for measuring the radiation axial ratio of any antenna with any polarization in accordance with the principles of the present invention.

DESCRIPTION OF THE PREFERRED EMBODIMENT

Before describing the circuit of the present invention, it is necessary to describe the action of the radiator (crossed slot) waveguide aperture.

The requirement for circular polarization uniquely dictates the position and general shape of the slots of a waveguide array. FIG. 1 illustrates the longitudinal and transverse magnetic fields of a $TE_{10}$ mode rectangular waveguide 1. The magnetic field components are in time quadrature, and are equal in magnitude at the points given by $$x = \frac{a}{\pi} \cotan^{-1}\{\pm [(\frac{2a}{\lambda})^2 - ]1]\}$$

, where a equals the width of waveguide 1, $\lambda$ equals the freespace wavelength and x equals the transverse coordinate. The currents in the broadwalls at the points determined by the above equation are circularly polarized. As a result, placing crossed slots with their centers at the prescribed location will result in interruptions of the circularly polarized currents thus producing circularly polarized radiation. The sense of the circular polarization will depend on which side of the waveguide centerline the crossed slots are placed. In addition, the direction of the exciting wave in the waveguide will determine the sense of polarization for any given slot. The sense of polarization can be changed by changing the direction of propagation in waveguide 1. The radiation properties of the slot are controlled by the slot width and length. It has been determined that for the same radiation characteristic, the maximum radiation obtainable from a given slot is approximately 70 to 75% of the available power. It has also been determined that the resonant frequency is increased by decreasing the length of the slot for a constant width. Measurements have also verified that the impedance match of the slot of the waveguide is extremely good over the frequency band of interest. This is enhanced since the small amount of energy reflected from the slot travels in the direction of the original wave and is either radiated by succeeding slots, or is absorbed in the termination of the waveguide.

A survey of the literature concerning slot radiators indicates that characterizing crossed slots in terms of their true circuit parameters has not been done since the slot is neither a series nor shunt circuit. To circumvent these difficulties, measurements were taken by treating a waveguide containing a crossed slot as a lossy transmission line. By measuring insertion loss of the waveguide with a single crossed slot versus a waveguide without the slot, the power radiated by the slot as well as the power transmitted to the waveguide termination were ascertained. It also was found that there was little change in phase as a result of introducing the radiating slot into the waveguide. This fact is substantiated in an article by A. J. Simmons, "Circularly Polarized Slot Radiators", IRE Transactions on Antennas and Propagation, January, 1957, Pages 31–36. The radiation axial ratio of a slot can be determined by examining the components of the surface current density for the $TE_{10}$ mode.

$$K_x = \pm jK_o(\frac{\lambda}{2a})\cos\frac{\pi x}{a} f(z)$$

$$K_z = \pm K_o\sqrt{1 - (\frac{\lambda}{2a})^2} \sin\frac{x}{a} f(z)$$

where $K_z$ and $K_x$ are the components of current density.

The Z-dependence of the currents are given by the function f(z) which indicated the Z variations and current along the longitudinal waveguide dimension.

The slot radiator may be analyzed, applying Babinet's principle, as that of a dipole radiator driven by electric currents given approximately by the unperturbed surface currents on the waveguide wall in the vicinity of the slot with the slot absent.

For a dipole radiator, the far fields are proportional to the excitation current density. The currents are shown in FIG. 2 for waves propagated in the ± Z-direction and for positions on both sides of the waveguide center line C—C. The circular arrows 2, 3, 4 and 5 indicate the direction of rotation of the elliptical polarization. It is seen that the radiation is generally elliptically polarized and the sense of polarization depends on two factors; (1) the direction of propagation in the waveguide, and (2) the location of the slot with respect to the center line of the waveguide. The radiation axial ratio is defined as:

$$RA = \left|\frac{K_z}{K_x}\right| = \frac{K_o\sqrt{1 - (\frac{\lambda}{2a})^2} \sin\frac{\pi x}{a} f(z)}{K_o(\frac{\lambda}{2a}) \cos\frac{\pi x}{a} f(z)}$$

$$= \frac{\sqrt{1 - (\frac{\lambda}{2a})^2}}{\lambda/2a} \tan\frac{\pi x}{a} = \frac{2a}{\lambda g} \tan\frac{\pi x}{a}$$

NOTE: $\frac{2a}{\lambda g} = \sqrt{(\frac{2a}{\lambda})^2 - 1}$

For the case where $$x = \frac{a}{4}, R_A = \sqrt{(\frac{2a}{\lambda})^2 - 1} = \frac{2a}{\lambda g}$$

where $R_A$ equals the radiation axial ratio, $\lambda$ equals freespace wavelength, $\lambda g$ equals the waveguide wavelength and a equals the waveguide broadwall dimension.

Within the band extending from 7.2 to 8.4 GHz (gigahertz), WR 112 waveguide is used. As a result, the theoretically predicted radiation axial ratios are as follows:

| Frequency (GHz) | $R_A$ (db) |
|---|---|
| 7.2 | 0.5 |
| 7.45 | 0.0 |
| 8.4 | 1.9 |

The preceeding description presents the theory upon which the present invention is based. The present invention is illustrated in FIG. 3 which illustrates a receiving circularly polarized crossed slot waveguide antenna 11, which is part of the circuit for measuring the radiation axial ratio. Left-hand (LH) circularly polarized waves travel to the left in FIG. 3 and the right-hand (RH) circularly polarized waves travel to the right in FIG. 3. This receiving antenna is connected to a broadband matched magic "TEE" hybrid 12 having one input to couple the right-hand circularly polarized waves from antenna 11 by a series circuit arrangement of a positive variable attenuator 13 and a precision variable phase shifter 14, while the other hybrid 12 input has left-hand circularly polarized waves coupled thereto accomplished by a series circuit including precision variable attenuator 15 and precision variable phase shifter 16. It is not required that the attenuators 13 and 15 and phase shifters 14 and 16 be in the position illustrated in the series circuits from antenna 11, but their positions may be interchanged. The array can be either a single line of continuous crossed slots or one left-hand circularly polarized array and one right-hand circularly polarized array. The purpose of the attenuators 13 and 15 and the phase shifters 14 and 16 is for calibration only since as shown by the equation for $R_A$ the inherent radiation axial ratio of the circuit of this invention will not be exactly zero over a broadband. This will be discussed further after demonstrating the basic working equation. Referring to the magic "TEE" ports $$\Sigma = LH + RH \quad \Delta = LH - RH$$

Condition for LINEAR POLARIZATION is when $LH = RH$ $$\therefore \Sigma = 2LH = 2RH \text{ and } \Delta = 0 \text{ or } \Delta/\Sigma = 0 \text{ or } \Sigma/\Delta$$
$$= \infty$$

The condition for pure circular polarization (zero axial ratio)

$$\Sigma = LH \text{ OR } RH \text{ and } \Delta = LH \text{ OR } RH$$

or $\Sigma/\Delta = 1$

Then the $$\text{AXIAL RATIO (dB)} = 20 \log \frac{V \text{ maximum}}{V \text{ minimum}} =$$
$$20 \log \left(\frac{V_{LH} + V_{RH}}{V_{LH} - V_{RH}}\right)$$
$$= 20 \log \frac{\Sigma}{\Delta}$$

It is evident that the immediately above equations would contain an error if the sampling antenna were not purely circularly polarized because residual signals would appear in the $\Sigma$ and $\Delta$ ports which are connected to microwave detecting meters 17 and 18. The reading of these meters and placing their appropriate value in the equation $R_A = 20 \log \Sigma/\Delta$ provides the desired radiation axial ratio. The purpose of the phase shifters 14 and 16 and attenuators 13 and 15 is to "zero out" or eliminate the residual signals to produce the condition for pure circular polarization. This can be accomplished with a zero db axial ratio radiation standard at calibration frequencies prior to performing any measurement of the radiation axial ratio. Once the calibration is performed, it need not be done again and a calibration chart for the radiator/circuit of the present invention can be used to adjust the phase shifters 14 and 16 and attenuators 13 and 15.

While I have described above the principles of my invention in connection with specific apparatus it is to be clearly understood that this description is made only by way of example and not as a limitation to the scope of my invention as set forth in the objects thereof and in the accompanying claims.

I claim:

1. A circuit for measuring the radiation axial ratio (R) of any antenna with any polarization comprising:
   a receiving circularly polarized crossed slot waveguide antenna having a longitudinal axis and spaced crossed slots disposed on a selected side of said axis spaced therefrom
   first means having an output difference port, an output sum port, a first input port coupled to said receiving antenna to receive therefrom left-hand circularly polarized waves and a second input port coupled to said receiving antenna to receive therefrom right-hand circularly polarized waves; and
   second means coupled to said difference port to detect the value of the difference ($\Delta$) of said waves coupled to said first and second input ports and to said sum port to detect the value of the sum ($\Sigma$) of said waves coupled to said first and second input ports to enable solving the equation $R = 20 \log \Sigma/\Delta$ to obtain the value of said radiation axial ratio.

2. A circuit according to claim 1, further including
   third means coupled between said first input port and said receiving antenna; and
   fourth means coupled between said second input port and said receiving antenna;
   said third and fourth means cooperating to eliminate residual signals to produce a condition for pure circular polarization.

3. A circuit according to claim 2, wherein
   each of said third and fourth means include
   a precision variable attenuator and a precision variable phase shifter coupled in series between said receiving antenna and an associated one of said first and second input ports.

4. A circuit according to claim 3, wherein
   said first means includes
   a broadband matched magic "TEE" hybrid.

5. A circuit according to claim 4, wherein
   said second means includes
   a first microwave meter coupled to said difference port, and
   a second microwave meter coupled to said sum port.

6. A circuit according to claim 2, wherein
   said second means includes
   a first microwave meter coupled to said difference port, and
   a second microwave meter coupled to said sum port.

7. A circuit according to claim 2, wherein
   said first means includes
   a broadband matched magic "TEE" hybrid.

8. A circuit according to claim 3, wherein
   said second means includes
   a first microwave meter coupled to said difference port, and
   a second microwave meter coupled to said sum port.

9. A circuit according to claim 1, wherein
   said first means includes
   a broadband matched magic "TEE" hybrid.

10. A circuit according to claim 9, wherein
    said second means includes
    a first microwave meter coupled to said difference port, and
    a second microwave meter coupled to said sum port.

11. A circuit according to claim 1, wherein
    said second means includes
    a first microwave meter coupled to said difference port, and
    a second microwave meter coupled to said sum port.

* * * * *